(12) United States Patent
Cooke et al.

(10) Patent No.: US 8,879,233 B2
(45) Date of Patent: *Nov. 4, 2014

(54) ELECTROSTATIC CHUCK WITH POLYMER PROTRUSIONS

(75) Inventors: Richard A. Cooke, Framingham, MA (US); Nate Richard, Peabody, MA (US); Steven Donnell, Burlington, MA (US); Mark Vose, Windham, NH (US); Yan Liu, Arlington, MA (US)

(73) Assignee: Entegris, Inc., Billerica, MA (US)

( * ) Notice: Subject to any disclaimer, the term of this patent is extended or adjusted under 35 U.S.C. 154(b) by 281 days.

This patent is subject to a terminal disclaimer.

(21) Appl. No.: 13/266,657

(22) PCT Filed: May 13, 2010

(86) PCT No.: PCT/US2010/034667
§ 371 (c)(1),
(2), (4) Date: Oct. 27, 2011

(87) PCT Pub. No.: WO2010/132640
PCT Pub. Date: Nov. 18, 2010

(65) Prior Publication Data
US 2012/0044609 A1 Feb. 23, 2012

Related U.S. Application Data

(60) Provisional application No. 61/216,305, filed on May 15, 2009.

(51) Int. Cl.
*H01T 23/00* (2006.01)
*H01L 21/683* (2006.01)
*H01L 21/687* (2006.01)

(52) U.S. Cl.
CPC ........ *H01L 21/6831* (2013.01); *H01L 21/6875* (2013.01)

USPC .......................................... 361/234

(58) Field of Classification Search
USPC .......................................... 361/234
See application file for complete search history.

(56) References Cited

U.S. PATENT DOCUMENTS

| 4,184,188 A | 1/1980 | Briglia |
| 5,179,498 A | 1/1993 | Hongoh et al. |

(Continued)

FOREIGN PATENT DOCUMENTS

| CN | 101043018 | 9/2007 |
| EP | 1 119 040 A2 | 7/2001 |

(Continued)

OTHER PUBLICATIONS

Non-Final Office Action for U.S. Appl. No. 12/454,336, "Electrostatic Chuck"; Date Mailed: Jul. 10, 2012.

(Continued)

*Primary Examiner* — Stephen W Jackson
(74) *Attorney, Agent, or Firm* — Hamilton, Brook, Smith & Reynolds, P.C.

(57) ABSTRACT

In accordance with an embodiment of the invention, there is provided an electrostatic chuck. The electrostatic chuck comprises a surface layer activated by a voltage in an electrode to form an electric charge to electrostatically clamp a substrate to the electrostatic chuck. The surface layer includes a plurality of polymer protrusions and a charge control layer to which the plurality of polymer protrusions adhere, the plurality of polymer protrusions extending to a height above portions of the charge control layer surrounding the plurality of polymer protrusions to support the substrate upon the plurality of polymer protrusions during electrostatic clamping of the substrate.

31 Claims, 5 Drawing Sheets

(56) References Cited

U.S. PATENT DOCUMENTS

| | | | |
|---|---|---|---|
| 5,250,137 | A | 10/1993 | Arami et al. |
| 5,310,453 | A | 5/1994 | Fukasawa et al. |
| 5,350,479 | A | 9/1994 | Collins et al. |
| 5,382,311 | A | 1/1995 | Ishikawa et al. |
| 5,413,360 | A * | 5/1995 | Atari et al. .................. 279/128 |
| 5,539,609 | A | 7/1996 | Collins et al. |
| 5,557,215 | A | 9/1996 | Saeki et al. |
| 5,583,736 | A | 12/1996 | Anderson et al. |
| 5,583,737 | A | 12/1996 | Collins et al. |
| 5,591,269 | A | 1/1997 | Arami et al. |
| 5,625,526 | A | 4/1997 | Watanabe et al. |
| 5,656,093 | A | 8/1997 | Burkhart et al. |
| 5,691,876 | A | 11/1997 | Chen et al. |
| 5,701,228 | A | 12/1997 | Ishii |
| 5,740,009 | A | 4/1998 | Pu et al. |
| 5,748,434 | A | 5/1998 | Rossman et al. |
| 5,761,023 | A | 6/1998 | Lue et al. |
| 5,764,471 | A | 6/1998 | Burkhart |
| 5,777,838 | A | 7/1998 | Tamagawa et al. |
| 5,779,803 | A | 7/1998 | Kurono et al. |
| 5,792,562 | A | 8/1998 | Collins et al. |
| 5,800,871 | A | 9/1998 | Collins et al. |
| 5,825,607 | A | 10/1998 | Burkhart |
| 5,851,298 | A | 12/1998 | Ishii |
| 5,868,848 | A | 2/1999 | Tsukamoto |
| 5,870,271 | A | 2/1999 | Herchen |
| 5,880,924 | A | 3/1999 | Kumar et al. |
| 5,886,865 | A | 3/1999 | Parkhe et al. |
| 5,886,866 | A | 3/1999 | Hausmann |
| 5,903,428 | A | 5/1999 | Grimard et al. |
| 5,908,334 | A | 6/1999 | Chen et al. |
| 5,914,568 | A | 6/1999 | Nonaka |
| 5,916,689 | A | 6/1999 | Collins et al. |
| 5,923,521 | A | 7/1999 | Burkhart |
| 5,946,183 | A | 8/1999 | Yamada et al. |
| 5,946,184 | A | 8/1999 | Kanno et al. |
| 5,997,962 | A | 12/1999 | Ogasawara et al. |
| 6,028,762 | A * | 2/2000 | Kamitani .................. 361/234 |
| 6,051,122 | A | 4/2000 | Flanigan |
| 6,055,150 | A | 4/2000 | Clinton et al. |
| 6,072,685 | A | 6/2000 | Herchen |
| 6,081,414 | A | 6/2000 | Flanigan et al. |
| 6,088,213 | A | 7/2000 | Herchen |
| 6,104,595 | A | 8/2000 | Brown |
| 6,104,596 | A | 8/2000 | Hausmann |
| 6,108,189 | A | 8/2000 | Weldon et al. |
| 6,117,246 | A | 9/2000 | Parkhe et al. |
| 6,125,025 | A | 9/2000 | Howald et al. |
| 6,134,096 | A | 10/2000 | Yamada et al. |
| 6,175,485 | B1 | 1/2001 | Krishnaraj et al. |
| 6,198,616 | B1 | 3/2001 | Dahimene et al. |
| 6,215,640 | B1 | 4/2001 | Hausmann |
| 6,217,655 | B1 | 4/2001 | Kumar et al. |
| 6,243,251 | B1 | 6/2001 | Kanno et al. |
| RE37,294 | E | 7/2001 | Knapp et al. |
| 6,259,592 | B1 | 7/2001 | Ono |
| 6,304,424 | B1 | 10/2001 | Mett et al. |
| 6,338,861 | B1 | 1/2002 | Gozu et al. |
| 6,370,004 | B1 | 4/2002 | Yamaguchi |
| 6,373,681 | B2 | 4/2002 | Kanno et al. |
| 6,414,834 | B1 | 7/2002 | Weldon et al. |
| 6,433,346 | B1 | 8/2002 | Hirayanagi |
| 6,441,939 | B1 | 8/2002 | Bigo et al. |
| 6,452,775 | B1 | 9/2002 | Nakajima |
| 6,475,336 | B1 | 11/2002 | Hubacek |
| 6,483,690 | B1 | 11/2002 | Nakajima et al. |
| 6,490,145 | B1 | 12/2002 | Kholodenko et al. |
| 6,522,519 | B1 | 2/2003 | Hirayanagi |
| 6,567,257 | B2 | 5/2003 | Brown |
| 6,608,745 | B2 * | 8/2003 | Tsuruta et al. ............... 361/234 |
| 6,625,003 | B2 | 9/2003 | Loo et al. |
| 6,628,503 | B2 | 9/2003 | Sogard |
| 6,634,177 | B2 | 10/2003 | Lin et al. |
| 6,641,939 | B1 | 11/2003 | Lee et al. |
| 6,646,233 | B2 | 11/2003 | Kanno et al. |
| 6,678,143 | B2 | 1/2004 | Masuda et al. |
| 6,687,113 | B2 | 2/2004 | Saito et al. |
| 6,721,162 | B2 | 4/2004 | Weldon et al. |
| 6,723,274 | B1 | 4/2004 | Divakar |
| 6,754,062 | B2 | 6/2004 | Logan et al. |
| 6,785,115 | B2 | 8/2004 | Tsuruta et al. |
| 6,790,375 | B1 | 9/2004 | Howald et al. |
| 6,813,134 | B2 | 11/2004 | Tatsumi et al. |
| 6,835,415 | B2 * | 12/2004 | Blaedel et al. ............ 427/248.1 |
| 6,839,217 | B1 | 1/2005 | Larsen |
| 6,853,953 | B2 | 2/2005 | Brcka et al. |
| 6,950,297 | B2 | 9/2005 | Kosakai |
| 6,982,125 | B2 | 1/2006 | LaCourse et al. |
| 7,042,697 | B2 | 5/2006 | Tsuruta et al. |
| 7,052,553 | B1 | 5/2006 | Shih et al. |
| 7,075,771 | B2 | 7/2006 | Brcka |
| 7,078,655 | B1 | 7/2006 | Ito et al. |
| 7,088,431 | B2 | 8/2006 | Ottens et al. |
| 7,142,405 | B2 | 11/2006 | Miyaji et al. |
| 7,175,737 | B2 | 2/2007 | Sago et al. |
| 7,187,433 | B2 | 3/2007 | Ottens et al. |
| 7,196,896 | B2 | 3/2007 | Howald et al. |
| 7,198,276 | B2 | 4/2007 | Caldwell et al. |
| 7,209,339 | B2 | 4/2007 | Kitabayashi et al. |
| 7,220,319 | B2 | 5/2007 | Sago et al. |
| 7,307,697 | B2 | 12/2007 | GanapathiSubramanian et al. |
| 7,330,346 | B2 | 2/2008 | Ikuhara et al. |
| 7,335,315 | B2 | 2/2008 | Matsuda et al. |
| 7,824,498 | B2 | 11/2010 | Parkhe et al. |
| 2001/0019472 | A1 | 9/2001 | Kanno et al. |
| 2001/0055190 | A1 | 12/2001 | Saito et al. |
| 2002/0000521 | A1 | 1/2002 | Brown |
| 2002/0008954 | A1 | 1/2002 | Leeser |
| 2002/0012219 | A1 | 1/2002 | Tsuruta et al. |
| 2002/0021545 | A1 | 2/2002 | Tatsumi et al. |
| 2002/0027762 | A1 | 3/2002 | Yamaguchi |
| 2002/0036373 | A1 | 3/2002 | Kosakai |
| 2002/0109955 | A1 | 8/2002 | Masuda et al. |
| 2002/0130276 | A1 | 9/2002 | Sogard |
| 2002/0135969 | A1 | 9/2002 | Weldon et al. |
| 2002/0144657 | A1 | 10/2002 | Chiang et al. |
| 2002/0144786 | A1 | 10/2002 | Chiang et al. |
| 2002/0146511 | A1 | 10/2002 | Chiang et al. |
| 2002/0159217 | A1 | 10/2002 | Tsuruta et al. |
| 2002/0167779 | A1 | 11/2002 | Carroll et al. |
| 2002/0170882 | A1 | 11/2002 | Akiba |
| 2003/0010292 | A1 | 1/2003 | Kholodenko et al. |
| 2003/0053283 | A1 | 3/2003 | Loo et al. |
| 2003/0095370 | A1 | 5/2003 | Tsuruta et al. |
| 2003/0123213 | A1 | 7/2003 | Kosakai |
| 2003/0165043 | A1 | 9/2003 | Logan et al. |
| 2003/0168439 | A1 | 9/2003 | Kanno et al. |
| 2004/0040665 | A1 | 3/2004 | Mizuno et al. |
| 2004/0055709 | A1 | 3/2004 | Boyd, Jr. et al. |
| 2004/0070916 | A1 | 4/2004 | Tsuruta et al. |
| 2004/0121192 | A1 | 6/2004 | LaCourse et al. |
| 2004/0124595 | A1 | 7/2004 | Miyaji et al. |
| 2004/0131775 | A1 | 7/2004 | Blaedel et al. |
| 2004/0160021 | A1 | 8/2004 | Tatsumi et al. |
| 2004/0173469 | A1 | 9/2004 | Udo et al. |
| 2004/0190215 | A1 | 9/2004 | Weldon et al. |
| 2004/0233608 | A1 | 11/2004 | Brcka |
| 2004/0233609 | A1 | 11/2004 | Yoshida et al. |
| 2005/0018377 | A1 | 1/2005 | Cho et al. |
| 2005/0029244 | A1 | 2/2005 | Ito et al. |
| 2005/0036268 | A1 | 2/2005 | Howald et al. |
| 2005/0045106 | A1 | 3/2005 | Boyd, Jr. et al. |
| 2005/0069726 | A1 | 3/2005 | Douglas et al. |
| 2005/0079737 | A1 | 4/2005 | Kellerman et al. |
| 2005/0087939 | A1 | 4/2005 | Caldwell et al. |
| 2005/0095410 | A1 | 5/2005 | Mazurkiewicz |
| 2005/0106320 | A1 | 5/2005 | Mehregany et al. |
| 2005/0263077 | A1 | 12/2005 | GanapathiSubramanian et al. |
| 2005/0264134 | A1 | 12/2005 | GanapathiSubramanian et al. |
| 2006/0108231 | A1 | 5/2006 | Weichart |
| 2006/0112969 | A1 | 6/2006 | Shih et al. |
| 2006/0121195 | A1 | 6/2006 | Udo et al. |
| 2006/0158823 | A1 | 7/2006 | Mizuno et al. |
| 2007/0047170 | A1 | 3/2007 | Sun et al. |

(56) References Cited

U.S. PATENT DOCUMENTS

| | | |
|---|---|---|
| 2007/0109714 A1 | 5/2007 | Chung |
| 2007/0128570 A1 | 6/2007 | Goto et al. |
| 2007/0195482 A1 | 8/2007 | Muka et al. |
| 2007/0217114 A1 | 9/2007 | Sasaki et al. |
| 2007/0217118 A1 | 9/2007 | Ikuhara et al. |
| 2007/0222131 A1 | 9/2007 | Fukumoto et al. |
| 2007/0223173 A1 | 9/2007 | Fujisawa et al. |
| 2007/0253139 A1 | 11/2007 | Nakano et al. |
| 2007/0258184 A1 | 11/2007 | Lee |
| 2007/0258186 A1 | 11/2007 | Matyushkin et al. |
| 2007/0283891 A1 | 12/2007 | Okayama |
| 2008/0017104 A1 | 1/2008 | Matyushkin et al. |
| 2008/0037195 A1 | 2/2008 | Himori et al. |
| 2008/0037196 A1 | 2/2008 | Yonekura et al. |
| 2008/0041312 A1 | 2/2008 | Matsuyama et al. |
| 2008/0062609 A1 | 3/2008 | Himori et al. |
| 2008/0062610 A1 | 3/2008 | Himori et al. |
| 2008/0062611 A1 | 3/2008 | Himori et al. |
| 2008/0062612 A1 | 3/2008 | Morioka et al. |
| 2008/0073032 A1 | 3/2008 | Koshiishi et al. |
| 2008/0083700 A1 | 4/2008 | Bernard et al. |
| 2008/0100983 A1 | 5/2008 | Purohit et al. |
| 2008/0106842 A1 | 5/2008 | Ito et al. |
| 2008/0144251 A1 | 6/2008 | Tao et al. |
| 2008/0239614 A1 | 10/2008 | Blake et al. |
| 2009/0242544 A1 | 10/2009 | Kano |
| 2009/0284894 A1 | 11/2009 | Cooke |
| 2013/0070384 A1 | 3/2013 | Cooke et al. |
| 2013/0120897 A1 | 5/2013 | Lin et al. |

FOREIGN PATENT DOCUMENTS

| | | | |
|---|---|---|---|
| EP | 1 801 961 | A2 | 6/2007 |
| JP | 02-027748 | A | 3/1990 |
| JP | 02-304946 | A | 12/1990 |
| JP | H05243367 | A | 9/1993 |
| JP | 11-214494 | A | 6/1999 |
| JP | 2000100917 | | 4/2000 |
| JP | 2002-141404 | A | 5/2002 |
| JP | 2002-299425 | A | 10/2002 |
| JP | 2003-060020 | | 2/2003 |
| JP | 2003282688 | A | 10/2003 |
| JP | 2004022889 | A | 1/2004 |
| JP | 2005/033125 | A | 2/2005 |
| JP | 2007/158286 | A | 6/2007 |
| JP | 2007158185 | A | 6/2007 |
| JP | 2007-194320 | A | 8/2007 |
| KR | 10-2005-0064912 | A | 6/2005 |
| KR | 10-2006-0081562 | | 7/2006 |
| KR | 100717694 | B1 | 5/2007 |
| KR | 10-2007-0066890 | A | 6/2007 |
| KR | 10-0755874 | B1 | 9/2007 |
| WO | WO 99/16122 | | 4/1999 |
| WO | WO 99/25006 | | 5/1999 |
| WO | WO 99/29001 | | 6/1999 |
| WO | WO 99/48148 | | 9/1999 |
| WO | WO 99/52144 | | 10/1999 |
| WO | WO 99/54928 | | 10/1999 |
| WO | WO 99/57753 | | 11/1999 |
| WO | WO 99/60613 | | 11/1999 |
| WO | WO 99/62115 | | 12/1999 |
| WO | WO 00/19519 | | 4/2000 |
| WO | WO 00/19592 | | 4/2000 |
| WO | WO 00/35003 | | 6/2000 |
| WO | WO 01/42163 | A2 | 6/2001 |
| WO | WO 02/31219 | A1 | 4/2002 |
| WO | WO 03/003449 | A2 | 1/2003 |
| WO | WO 03/008666 | A1 | 1/2003 |
| WO | WO 2004/027839 | A2 | 4/2004 |
| WO | WO 2004/059701 | A2 | 7/2004 |
| WO | WO 2004/059714 | A1 | 7/2004 |
| WO | WO 2004/107387 | A2 | 12/2004 |
| WO | WO 2005/119802 | A2 | 12/2005 |
| WO | WO 2006/060234 | A2 | 6/2006 |
| WO | WO 2007/043519 | A1 | 4/2007 |
| WO | WO 2007/064435 | A2 | 6/2007 |
| WO | WO 2007/100571 | A2 | 9/2007 |
| WO | WO 2008/088471 | A1 | 7/2008 |
| WO | WO 2008/118683 | A1 | 10/2008 |
| WO | WO 2009/013803 | A1 | 1/2009 |
| WO | WO 2009/142710 | A1 | 11/2009 |
| WO | WO 2010/132640 | A2 | 11/2010 |
| WO | WO 2011/149918 | A2 | 12/2011 |
| WO | WO 2012/033922 | A2 | 3/2012 |

OTHER PUBLICATIONS

Notification of Transmittal of the International Search Report and Written Opinion of the International Searching Authority from counterpart International Application No. PCT/US2010/034667, dated Feb. 1, 2011.
International Search Report from counterpart International Application No. PCT/US2009/003015, dated Jul. 16, 2009.
Written Opinion of the International Searching Authority from counterpart International Application No. PCT/US2009/003015, dated Jul. 16, 2009.
International Preliminary Report on Patentability from counterpart International Application No. PCT/US2009/003015, Dated: Dec. 2, 2010.
International Preliminary Report on Patentability for PCT/US2010/034667, Date of Issuance: Nov. 15, 2011 (4 pgs.).
Non-Final Office Action for U.S. Appl. No. 12/454,336 dated Dec. 20, 2012, "Electrostatic Chuck".
Notification of Transmittal of the International Search Report and Written Opinion of the International Searching Authority from counterpart International Application No. PCT/US2011/037712, "High Surface Resistivity Electrostatic Chuck," Dated: Jan. 10, 2012.
International Preliminary Report on Patentability from counterpart International Application No. PCT/US2011/037712, "High Surface Resistivity Electrostatic Chuck," Dated: Sep. 18, 2012.
Supplementary European Search Report, EP10775520, Dated Oct. 18, 2013 "Electrostatic Chuck with Polymer Protrusions."
Notification of Transmittal of the International Search Report and Written Opinion of the International Searching Authority from counterpart International Application No. PCT/US2013/067301, Dated: Jan. 16, 2014 (10 pgs.) "Electrostatic Chuck with Photo-Patternable Soft Protrusion Contact Surface."
Non-Final Office Action for U.S. Appl. No. 12/454,336; Date Mailed: Mar. 26, 2013 (No. 892) "Electrostatic Chuck."
Final Office Action for U.S. Appl. No. 12/454,336; Date Mailed: Oct. 15, 2013 (No. 892) "Electrostatic Chuck."
Non-Final Office Action for U.S. Appl. No. 12/454,336, "Electrostatic Chuck"; Date Mailed: Feb. 26, 2014.
Search Report for Taiwan Application No. 098115989 "Electrostatic Chuck"; Date of Completion: Feb. 17, 2014.
Non-Final Office Action for U.S. Appl. No. 13/699,279, "High Surface Resistivity Electrostatic Chuck"; Date Mailed: Mar. 12, 2014.
Notice of Allowance for U.S. Appl. No. 13/667,516, "Electrostatic Chuck with Photo-Patternable Soft Protrusion Contact Surface", Date Mailed: Jun. 13, 2014.

* cited by examiner

ELECTROSTATIC CHUCK WITH POLYMER PROTRUSIONS

RELATED APPLICATION

This application is the U.S. National Stage of International Application No. PCT/US2010/034667, filed May 13, 2010, which designates the U.S., published in English, and claims the benefit of U.S. Provisional Application No. 61/216,305, filed on May 15, 2009. The entire teachings of the above applications are incorporated herein by reference.

BACKGROUND OF THE INVENTION

An electrostatic chuck holds and supports a substrate during a manufacturing process and also removes heat from the substrate without mechanically clamping the substrate. During use of an electrostatic chuck, the back side of a substrate, such as a semiconductor wafer, is held to the face of the electrostatic chuck by an electrostatic force. The substrate is separated from one or more electrodes in the face of the electrostatic chuck by a surface layer of material that covers the electrode. In a Coulombic chuck, the surface layer is electrically insulating, while in a Johnsen-Rahbek electrostatic chuck, the surface layer is weakly conducting. The surface layer of the electrostatic chuck may be flat or may have one or more protrusions, projections or other surface features that further separate the back side of the substrate from the covered electrode. Heat delivered to the substrate during processing can be transferred away from the substrate and to the electrostatic chuck by contact heat conduction with the protrusions and/or by gas heat conduction with a cooling gas. Contact heat conduction is generally more efficient than gas heat conduction in removing heat from the substrate. However, controlling the amount of contact between the substrate and the protrusions can be difficult.

In microelectronics production, as semiconductor and memory device geometries become progressively smaller and the sizes of wafers, flat screen displays, reticles and other processed substrates become progressively larger, the allowable particulate contamination process specifications become more restrictive. The effect of particles on electrostatic chucks is of particular concern because the wafers physically contact or mount to the chuck clamping surface. If the mounting surface of the electrostatic chuck allows any particulate to become entrapped between the mounting surface and the substrate, the substrate may be deformed by the entrapped particle. For example, if the back side of a wafer is clamped electrostatically against a flat reference surface, the entrapped particle could cause a deformation of the front side of the wafer, which will therefore not lie in a flat plane. According to U.S. Pat. No. 6,835,415, studies have shown that a 10-micron particle on a flat electrostatic chuck can displace the surface of a reticle (i.e., a test wafer) for a radial distance of one inch or more. The actual height and diameter of the particle-induced displacement is dependent on numerous parameters such as the particle size, the particle hardness, the clamping force and the reticle thickness.

During substrate processing it is important to be able to control the temperature of the substrate, limit the maximum temperature rise of the substrate, maintain temperature uniformity over the substrate surface, or any combination of these. If there are excessive temperature variations across the substrate surface due to poor and/or non-uniform heat transfer, the substrate can become distorted and process chemistry can be affected. The greater the area of direct contact with the electrostatic chuck, the greater the heat transferred by contact heat conduction. The size of the area of direct contact is a function of the roughness, flatness and hardness of the contact surfaces of the substrate and electrostatic chuck, as well as of the applied pressure between the contact surfaces. Since the characteristics of the contact surface vary from substrate to substrate, and since the characteristics of the contact surface can change over time, accurately controlling contact heat conductance between the electrostatic chuck and substrate is difficult.

Controlling the temperature of a substrate and the number of particles on its back side is important for reducing or eliminating damage to microelectronic devices, reticle masks and other such structures, and for reducing or minimizing manufacturing yield loss. The abrasive properties of the electrostatic chuck protrusions, the high contact area of roughened protrusions, and the effect of lapping and polishing operations during manufacture of electrostatic chucks may all contribute adder particles to the back side of substrates during use with an electrostatic chuck.

SUMMARY OF THE INVENTION

In accordance with an embodiment of the invention, there is provided an electrostatic chuck. The electrostatic chuck comprises a surface layer activated by a voltage in an electrode to form an electric charge to electrostatically clamp a substrate to the electrostatic chuck. The surface layer includes a plurality of polymer protrusions and a charge control layer to which the plurality of polymer protrusions adhere, the plurality of polymer protrusions extending to a height above portions of the charge control layer surrounding the plurality of polymer protrusions to support the substrate upon the plurality of polymer protrusions during electrostatic clamping of the substrate.

In further, related embodiments, the polymer of which the plurality of polymer protrusions are formed may comprise polyetherimide (PEI), polyimide or polyether ether ketone (PEEK). The charge control layer may be formed of a polymer, such as polyetherimide (PEI), polyimide or polyether ether ketone (PEEK). An adhesive layer may underlie the charge control layer, and may comprise polyetherimide (PEI). The electrostatic chuck may comprise an adhesion coating layer. The adhesion coating layer may comprise at least one of silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon. The adhesion coating layer may extend to comprise a metals reduction layer surrounding at least a portion of an edge of the electrostatic chuck. The electrostatic chuck may comprise a ceramic to ceramic bonding layer that bonds a dielectric layer of the electrostatic chuck to an insulator layer of the electrostatic chuck, the ceramic to ceramic bonding layer comprising a polymer, such as at least one of polytetrafluoroethylene (PTFE) and modified polytetrafluoroethylene (PTFE), and/or at least one of perfluoroalkoxy (PFA), fluorinated ethylene-propylene (FEP) and polyether ether ketone (PEEK). The modified polytetrafluoroethylene (PTFE) may comprise at least one of perfluoroalkoxy (PFA) and fluorinated ethylene-propylene (FEP). The plurality of polymer protrusions may be substantially equally spaced across the surface layer as measured by center to center distance between pairs of neighboring polymer protrusions. The polymer protrusions may be arranged in a trigonal pattern. The polymer protrusions may comprise a center to center distance of between about 6 mm and about 8 mm; and may comprise a height of between about 3 microns and about 12 microns; and may comprise a diameter of about 900 microns. The charge control layer may comprise a surface resistivity of between about $10^8$ ohms per square to about $10^{11}$ ohms per square. The electrostatic chuck may further comprise a gas seal ring comprising a polymer, such as polyetherimide (PEI), polyimide or polyether ether ketone (PEEK). The plurality of polymer protrusions may comprise a surface roughness of between about 0.02 μm and about 0.05 μm.

In a further embodiment according to the invention, there is provided a method of manufacturing an electrostatic chuck. The method comprises bonding a dielectric layer of the electrostatic chuck to an insulator layer of the electrostatic chuck using a bonding polymer comprising at least one of polytetrafluoroethylene (PTFE), modified polytetrafluoroethylene (PTFE), perfluoroalkoxy (PFA), fluorinated ethylene-propylene (FEP) and polyether ether ketone (PEEK); coating the dielectric layer of the electrostatic chuck with an adhesion coating layer comprising at least one of silicon containing nitride, silicon containing oxide, silicon containing carbide, non-stoichiometric silicon containing nitride, non-stoichiometric silicon containing oxide, non-stoichiometric silicon containing carbide carbon and a nitride compound of carbon; bonding a charge control layer comprising a charge control layer polymer to the surface of the electrostatic chuck, the charge control layer polymer comprising at least one of polyetherimide (PEI), polyimide and polyether ether ketone (PEEK); depositing a photoresist onto the charge control layer; reactive ion etching the charge control layer to remove portions of the charge control layer that will surround a plurality of polymer protrusions being formed in the charge control layer; and stripping the photoresist off the electrostatic chuck, thereby revealing the plurality of polymer protrusions being formed of the same charge control layer polymer as the charge control layer.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

In accordance with an embodiment of the invention, there is provided an electrostatic chuck that includes protrusions on its surface for mounting a substrate. The protrusions are formed of a polymer substance, such as polyetherimide (PEI), polyimide or polyether ether ketone (PEEK). Further, the electrostatic chuck features a charge control surface layer, to which the polymer protrusions adhere. The charge control surface layer may be formed of the same polymer substance as the protrusions, such as polyetherimide (PEI), polyimide or polyether ether ketone (PEEK). Such protrusions and charge control surface layer may assist with encouraging contact of the electrostatic chuck with the substrate to promote contact cooling, while also reducing production of undesirable particles.

Figure 1:
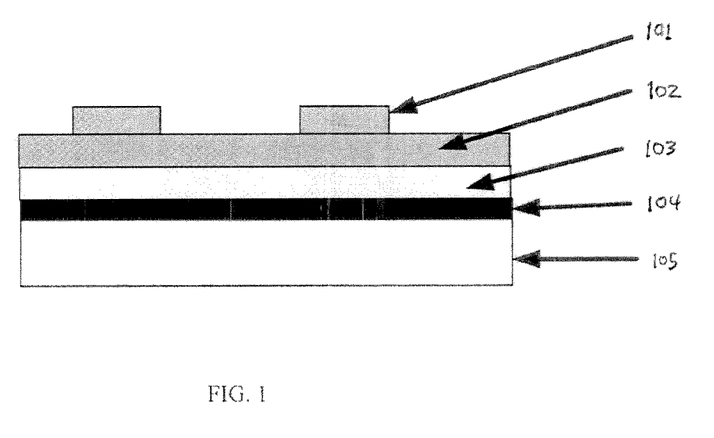
FIG. 1 is a cross-sectional diagram of the top layers of an electrostatic chuck in accordance with an embodiment of the invention.

FIG. 1 is a cross-sectional diagram of the top layers of an electrostatic chuck in accordance with an embodiment of the invention. The electrostatic chuck features protrusions 101 that are formed of a polymer, such as polyetherimide (PEI), polyimide or polyether ether ketone (PEEK). The gas seal rings (not shown) of the electrostatic chuck may be formed of a polymer, such as the same polymer as the protrusions 101. The protrusions 101 adhere to a charge control layer 102, which may also be formed of a polymer. The purpose of the charge control layer 102 is to provide a conductive layer to bleed away surface charge. The charge control layer 102 reduces the likelihood of "wafer sticking," which occurs when a wafer or other substrate electrostatically adheres to the chuck surface after the chuck power is removed. A charge control layer 102 having a surface resistivity in an appropriate range, such as, for example, a range of from about $1\times10^8$ ohms/square to about $1\times10^{11}$ ohms/square, has been shown to reduce surface charge retention that can lead to undesirable electrostatic force and ultimately to wafer sticking. The slightly conductive surface layer bleeds charge to ground (not shown) while not interfering with the electrostatic attraction between the electrostatic chuck and the substrate. In one embodiment, both the protrusions 101 and the charge control layer 102 are formed of a single polymer, such as polyetherimide (PEI), polyimide or polyether ether ketone (PEEK). An adhesive layer 103 may be underneath the charge control layer 102, and may comprise a different polymer from the charge control layer. In particular, where the charge control layer is formed of polyether ether ketone (PEEK), the adhesive layer 103 may comprise polyetherimide (PEI). Alternatively, the adhesive layer 103 need not be present. Underneath the adhesive layer 103 (or directly underneath the charge control layer 102), the electrostatic chuck includes an adhesion coating 104 that encourages the polymer layers above it to adhere to the dielectric layer 105. The adhesion coating 104 stays buried under the polymer layers above it, and hides cosmetic defects in the polymers. The adhesion coating 104 may, for example, include silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon; and/or a combination of any of the foregoing. Underneath the adhesion coating 104 is a dielectric layer 105, such as an alumina dielectric.

Figure 2:
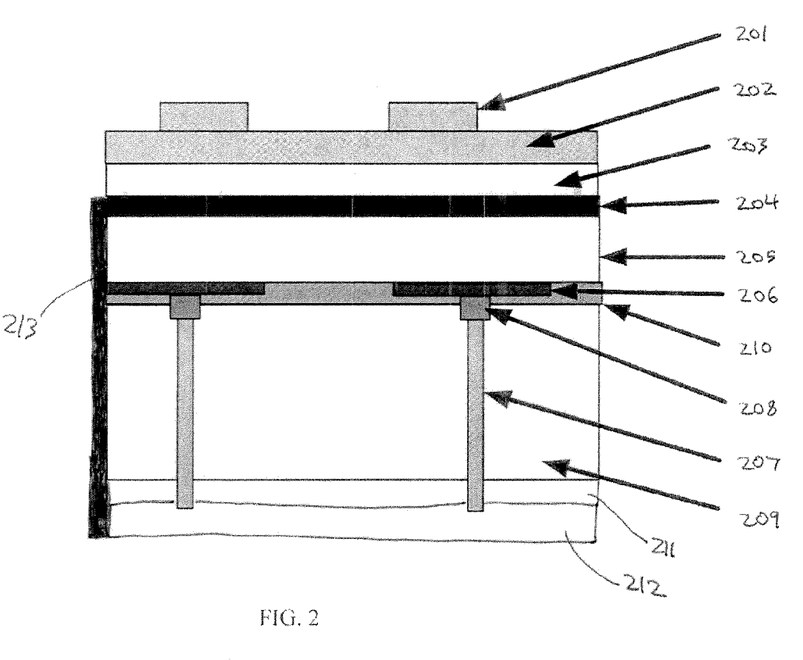
FIG. 2 is a cross-sectional diagram showing further layers of an electrostatic chuck in accordance with an embodiment of the invention.

FIG. 2 is a cross-sectional diagram showing further layers of an electrostatic chuck in accordance with an embodiment of the invention. In addition to protrusions 201, charge control layer 202, adhesive layer 203, adhesion coating 204 and dielectric layer 205, the electrostatic chuck includes metal electrodes 206. The metal electrodes 206 are bonded to electrode pins 207 by electrically conductive epoxy bonds 208. The dielectric layer 205 is bonded to a insulator layer 209, such as an alumina insulator, by a ceramic to ceramic bond 210. The ceramic to ceramic bond 210 may be formed of a polymer, such as polytetrafluoroethylene (PTFE) or modified PTFE (which includes PFA and/or FEP in addition to PTFE). Further, the ceramic to ceramic bond 210 may be formed of polymers such as perfluoroalkoxy (PFA), fluorinated ethylene-propylene (FEP) and polyether ether ketone (PEEK). Underneath the insulator 209 there is a thermally conductive bond 211 (which may be formed, for example, using TRA-CON thermally conductive epoxy, sold by TRA-CON, Inc. of Bedford, Mass., U.S.A.) and a water cooled base 212. The adhesion coating 204 may extend down an edge of the electrostatic chuck (including down the edges of the gas seal rings) to form a metals reduction layer 213, which prevents beam strikes on the edges of the electrostatic chuck from causing aluminum particles to strike the substrate.

In accordance with an embodiment of the invention, the polyetherimide (PEI) used for the protrusions 201, charge control layer 202 or other components of the electrostatic chuck may be formed of unfilled amorphous polyether imide (PEI), in a thickness of between about 12 microns and about 25 microns. For example, PEI sold under the tradename ULTEM 1000 may be used, sold by Sabic Innovative Plastics Holdings BV. Where the protrusions 201 and/or charge control layer 202 or other components are formed of polyether ether ketone (PEEK), they may be made from unfilled PEEK, in a thickness of between about 12 microns and about 25 microns. For example, PEEK sold under the trade name Victrex® APTIV PEEK™ FILM, 2000-006 (unfilled amorphous grade) may be used, sold by Victrex U.S.A., Inc. of West Conshohocken, Pa., U.S.A.

An electrostatic chuck featuring polymer protrusions and a polymer charge control layer in accordance with an embodiment of the invention may include features of the electrostatic chuck of U.S. patent application Ser. No. 12/454,336, filed on May 15, 2009, published as U.S. Patent Application Publication No. 2009/0284894, the teachings of which are hereby incorporated by reference in their entirety. In particular, features relating to equally spaced protrusions, trigonal pattern protrusions and low particle production may be included, and other features may also be included.

Figure 3:
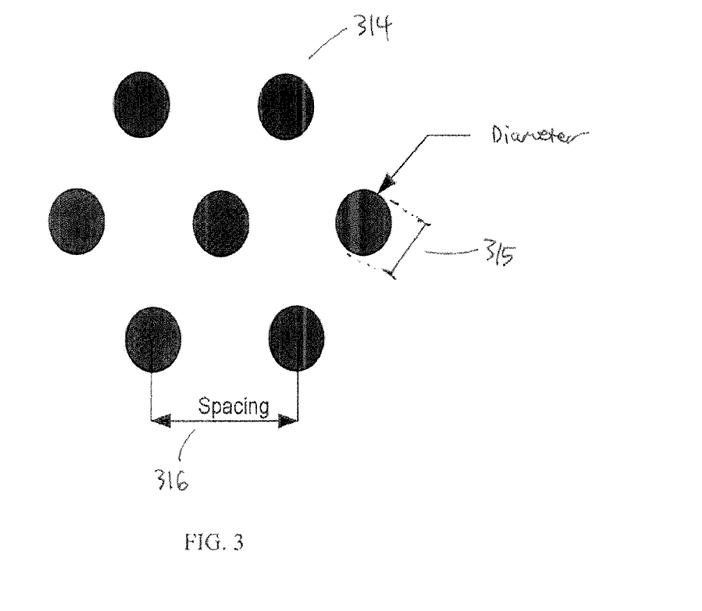
FIG. 3 is an illustration of a pattern of protrusions on the surface of an electrostatic chuck in accordance with an embodiment of the invention.

FIG. 3 is an illustration of a pattern of protrusions 314 on the surface of an electrostatic chuck, in accordance with an embodiment of the invention, in which the protrusion pattern is used to reduce the forces between a substrate and the protrusions 314. Protrusion patterns that equally distribute such forces may be used, for example trigonal or generally hexagonal patterns of protrusions. It should be appreciated that, as used herein, a "trigonal" pattern is intended to mean a regularly repeating pattern of equilateral triangles of protrusions, such that the protrusions are substantially equally spaced apart. (Such a pattern may also be viewed as being generally hexagonal in shape, with a central protrusion in the center of an array of six protrusions that form the vertices of a regular hexagon). Forces may also be reduced by increasing the diameter 315 of the protrusions, or by decreasing the center-to-center spacing 316 of the protrusions 314. As shown in the embodiment of FIG. 3, the protrusions may be disposed in an equally spaced arrangement, in which each protrusion is substantially equally spaced apart from the adjacent protrusions by a center to center spacing dimension 316. By virtue of such spacing, a substantial portion of the back side of the substrate contacts the top portion of the protrusions, leaving a gap between the protrusions for helium or other gas for back side cooling. By contrast, without such protrusion spacing, only a small portion, 10% or less, of the protrusions may contact the substrate. In accordance with an embodiment of the invention the substrate may contact greater than 25% of the protrusion's top surface area.

In one example, the electrostatic chuck may be a 300 mm configuration, including an aluminum base, an alumina insulator 209 of about 0.120 inches in thickness, an alumina dielectric 205 of about 0.004 inches thickness, and having a rotary platen design to allow rotating and tilting of the substrate that is mounted to the electrostatic chuck. The diameter of the electrostatic chuck may, for example, be 300 mm, 200 mm or 450 mm. The protrusions 314 may be in a trigonal pattern, with a center to center spacing dimension 316 of from about 6 mm to about 8 mm, for example. The diameter 315 of the protrusions may, for example, be about 900 microns. The height of the protrusions 314 may, for example, be from about 3 microns to about 12 microns, such as about 6 microns. The protrusions 314 may be formed entirely of polymer, as may be the charge control layer 202 (see FIG. 2).

Figure 4:
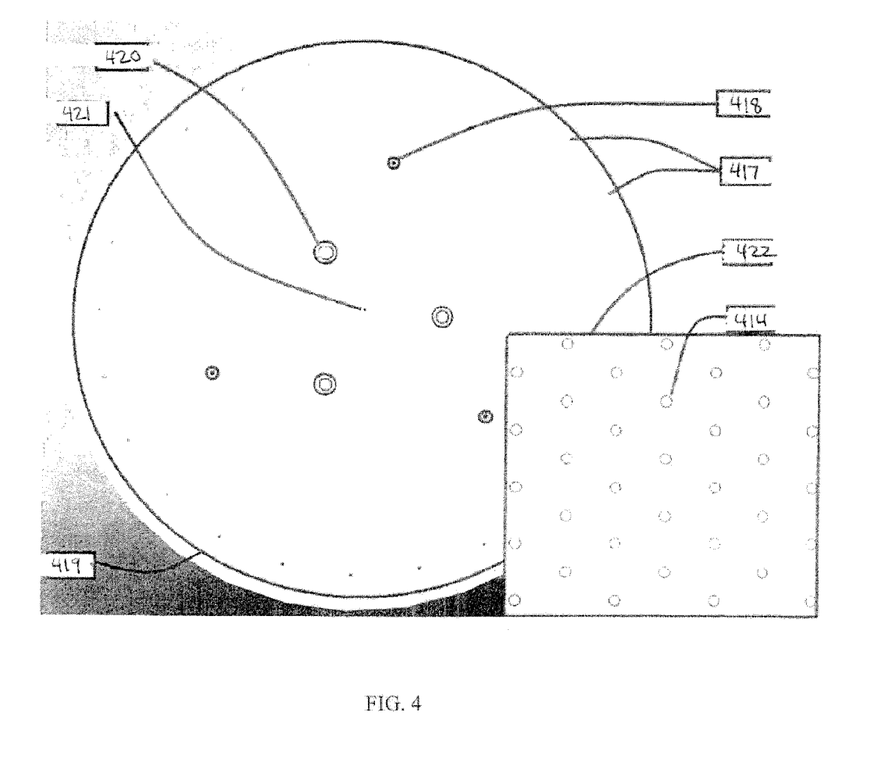
FIG. 4 is a diagram of the surface appearance of an electrostatic chuck in accordance with an embodiment of the invention.

FIG. 4 is a diagram of the surface appearance of an electrostatic chuck in accordance with an embodiment of the invention. The electrostatic chuck surface includes gas inlets 417, a ground pin passage 418, a gas seal ring 419, a lift pin passage 420 that includes its own gas seal ring (outer light-colored structure of lift pin passage 420 in FIG. 4), and a small gas inlet at 421 in the center of the chuck (inlet not visible in FIG. 4). The ground pin passage 418 may include its own gas seal ring (outer ring of ground pin passage 419 in FIG. 4). A detail view (inset 422 in FIG. 4) shows the protrusions 414. The gas seal ring 419 (and the gas seal rings of the lift pin passages 420 and ground pin passages 418) may be about 0.1 inches in width and may have an equal height to that of the protrusions 414, such as from about 3 microns to about 12 microns, for example about 6 microns, although other widths and heights are possible.

In accordance with an embodiment of the invention, an electrostatic chuck may be made by the process of, first, preparing the ceramic assembly using a ceramic to ceramic bond. For example, the dielectric layer 205 may be bonded to the insulator layer 209 using the bonding substances described above in connection with the embodiment of FIG. 2. Next, the ceramic assembly is coated with the adhesion coating 204, such as the substances discussed above in connection with the embodiment of FIG. 1, to a thickness of about 1 or 2 microns. Next, the polymer substance that will make up the charge control layer 202 and protrusions 201 is bonded to the surface of the adhesion coating 204. The top of the polymer substance may then be plasma treated to help photoresist (applied next) to stick. Next, photoresist is deposited on the polymer substance, and is exposed and developed. Next, a reactive ion etch process is used to remove a thickness of the polymer substance (such as between about 3 microns and about 12 microns, in particular about 6 microns) to create the areas between the protrusions 201. The amount etched away (resulting in the height of the protrusions) may be optimized for the back side gas pressure that will be used with the electrostatic chuck. The height of the protrusions is preferably approximately the same as, or substantially equal to, the mean free path of the gas used in back side cooling. After etching, the photoresist is then stripped off, and the process proceeds to final assembly of the electrostatic chuck.

Figure 5:
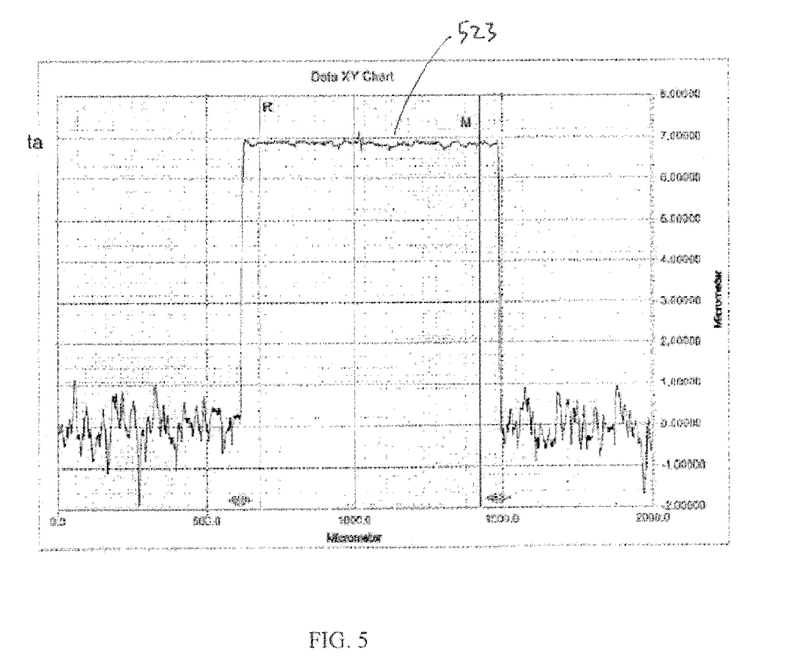
FIG. 5 is a diagram of the profile of a protrusion on an electrostatic chuck in accordance with an embodiment of the invention.

FIG. 5 is a diagram of the profile of a protrusion on an electrostatic chuck in accordance with an embodiment of the invention. The width and height are shown in micrometers. The protrusion is about 6 microns in height, and has a very smooth wafer contact surface 523. For example, the protrusion may have a surface roughness on the wafer contact surface 523 of about 0.02 to about 0.05 μm. Likewise, the gas seal rings may have a similarly smooth surface, which results in a good seal with the substrate. Table 1, below, shows the results of a gas leak rate experiment in accordance with an embodiment of the invention. The left column shows the back side gas pressure applied, the right column shows the back side gas flow, which occurs as a result of gas leaks out from under the edges of the electrostatic chuck, and the middle column shows the chamber pressure, which will rise as more gas leaks out the edge of the electrostatic chuck. Results of less than 1 sccm back side gas flow rate (as here) are considered desirable.

TABLE 1

Gas Leak Rate Test

| BSG Pressure (Torr) | Chamber Pressure (Torr) | BSG Flow (sccm) |
|---|---|---|
| 0 | 2.44E−06 | na |
| 4 | 5.17E−06 | 0.09 |
| 10 | 9.04E−06 | 0.34 |
| 15 | 1.24E−05 | 0.56 |
| 25 | 2.02E−065 | 1.1 |

In accordance with an embodiment of the invention, the gas seal rings of the electrostatic chuck may comprise a surface roughness of less than about 8 microinches, or less than about 4 microinches, or less than about 2 microinches, or less than about 1 microinches.

In accordance with an embodiment of the invention, the electrostatic chuck is a Coulombic chuck. The dielectric can include aluminum, for example alumina or aluminum nitride. In a further embodiment according to the invention, the electrostatic chuck is a Johnsen-Rahbek electrostatic chuck. Alternatively, the electrostatic chuck may not be a Johnsen-Rahbek electrostatic chuck, and the dielectric may be chosen so that a Johnsen-Rahbek (JR) force or partial hybrid Johnsen-Rahbek force does not act on the wafer or substrate.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An electrostatic chuck comprising:
a surface layer activated by a voltage in an electrode to form an electric charge to electrostatically clamp a substrate to the electrostatic chuck, the surface layer including a plurality of polymer protrusions and a charge control layer to which the plurality of polymer protrusions adhere, the charge control layer being a polymer charge control layer and comprising a surface resistivity of between about $10^8$ ohms per square to about $10^{11}$ ohms per square, the plurality of polymer protrusions extending to a height above portions of the charge control layer surrounding the plurality of polymer protrusions to support the substrate upon the plurality of polymer protrusions during electrostatic clamping of the substrate.

2. An electrostatic chuck according to claim 1, wherein the polymer of which the plurality of polymer protrusions are formed comprises polyetherimide (PEI).

3. An electrostatic chuck according to claim 2, wherein the charge control layer is formed of polyetherimide (PEI).

4. An electrostatic chuck according to claim 1, wherein the polymer of which the plurality of polymer protrusions are formed comprises polyether ether ketone (PEEK).

5. An electrostatic chuck according to claim 1, wherein the polymer of which the plurality of polymer protrusions are formed comprises polyimide.

6. An electrostatic chuck according to claim 1, wherein the charge control layer is formed of polyetherimide (PEI).

7. An electrostatic chuck according to claim 1, wherein the charge control layer is formed of polyether ether ketone (PEEK).

8. An electrostatic chuck according to claim 7, wherein the polymer of which the plurality of polymer protrusions are formed comprises polyether ether ketone (PEEK).

9. An electrostatic chuck according to claim 1, wherein the charge control layer is formed of polyimide.

10. An electrostatic chuck according to claim 9, wherein the polymer of which the plurality of polymer protrusions are formed comprises polyimide.

11. An electrostatic chuck according to claim 1, further comprising an adhesive layer underlying the charge control layer.

12. An electrostatic chuck according to claim 11, wherein the adhesive layer comprises polyetherimide (PEI).

13. An electrostatic chuck according to claim 1, further comprising an adhesion coating layer.

14. An electrostatic chuck according to claim 13, wherein the adhesion coating layer comprises at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon.

15. An electrostatic chuck according to claim 14, wherein the adhesion coating layer comprises at least one of $SiO_xN_y$, silicon nitride, silicon oxide, silicon carbide, and diamond-like carbon.

16. An electrostatic chuck according to claim 13, wherein the adhesion coating layer extends to comprise a metals reduction layer surrounding at least a portion of an edge of the electrostatic chuck.

17. An electrostatic chuck according to claim 1, further comprising a ceramic to ceramic bonding layer that bonds a dielectric layer of the electrostatic chuck to an insulator layer of the electrostatic chuck, the ceramic to ceramic bonding layer comprising a polymer.

18. An electrostatic chuck according to claim 17, wherein the polymer of the ceramic to ceramic bonding layer comprises at least one of polytetrafluoroethylene (PTFE) and modified polytetrafluoroethylene (PTFE).

19. An electrostatic chuck according to claim 18, wherein the modified polytetrafluoroethylene (PTFE) comprises at least one of perfluoroalkoxy (PFA) and fluorinated ethylene-propylene (FEP).

20. An electrostatic chuck according to claim 17, wherein the polymer of the ceramic to ceramic bonding layer comprises at least one of perfluoroalkoxy (PFA), fluorinated ethylene-propylene (FEP) and polyether ether ketone (PEEK).

21. An electrostatic chuck according to claim 1, wherein the plurality of polymer protrusions are substantially equally spaced across the surface layer as measured by center to center distance between pairs of neighboring polymer protrusions.

22. An electrostatic chuck according to claim 21, wherein the protrusions are arranged in a trigonal pattern.

23. An electrostatic chuck according to claim 22, wherein the polymer protrusions comprise a center to center distance of between about 6 mm and about 8 mm.

24. An electrostatic chuck according to claim 22, wherein the polymer protrusions comprise a height of between about 3 microns and about 12 microns.

25. An electrostatic chuck according to claim 22, wherein the polymer protrusions comprise a diameter of about 900 microns.

26. An electrostatic chuck according to claim 1, further comprising a gas seal ring comprising a polymer.

27. An electrostatic chuck according to claim 26, wherein the gas seal ring comprises at least one of polyetherimide (PEI), polyimide and polyether ether ketone (PEEK).

28. An electrostatic chuck according to claim 1, wherein the plurality of polymer protrusions comprise a surface roughness of between about 0.02 μm and about 0.05 μm.

29. An electrostatic chuck according to claim 1, wherein the polymer of which the plurality of polymer protrusions are formed comprises polyetherimide (PEI), wherein the charge control layer is formed of polyetherimide (PEI), and wherein the electrostatic chuck comprises an adhesion coating layer comprising at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon.

30. An electrostatic chuck according to claim 29, further comprising a ceramic to ceramic bonding layer that bonds a dielectric layer of the electrostatic chuck to an insulator layer of the electrostatic chuck, the ceramic to ceramic bonding layer comprising at least one of polytetrafluoroethylene (PTFE) and modified polytetrafluoroethylene (PTFE).

31. A method of manufacturing an electrostatic chuck, the method comprising:

bonding a dielectric layer of the electrostatic chuck to an insulator layer of the electrostatic chuck using a bonding polymer comprising at least one of polytetrafluoroethylene (PTFE), modified polytetrafluoroethylene (PTFE), perfluoroalkoxy (PFA), fluorinated ethylene-propylene (FEP) and polyether ether ketone (PEEK);

coating the dielectric layer of the electrostatic chuck with an adhesion coating layer comprising at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon;

bonding a charge control layer comprising a charge control layer polymer to the surface of the electrostatic chuck, the charge control layer polymer comprising at least one of polyetherimide (PEI), polyimide and polyether ether ketone (PEEK), the charge control layer comprising a surface resistivity of between about $10^8$ ohms per square to about $10^{11}$ ohms per square;

depositing a photoresist onto the charge control layer;

reactive ion etching the charge control layer to remove portions of the charge control layer that will surround a plurality of polymer protrusions being formed in the charge control layer; and stripping the photoresist off the electrostatic chuck, thereby revealing the plurality of polymer protrusions being formed of the same charge control layer polymer as the charge control layer.

* * * * *